(12) United States Patent
Wang

(10) Patent No.: US 6,570,760 B1
(45) Date of Patent: May 27, 2003

(54) CPU COOLING ARRANGEMENT FOR PORTABLE COMPUTER

(76) Inventor: Jiung-Jung Wang, 10F, No. 15, Sec. 2, Keelung Road, Taipei (TW)

( * ) Notice: Subject to any disclaimer, the term of this patent is extended or adjusted under 35 U.S.C. 154(b) by 0 days.

(21) Appl. No.: 09/926,473

(22) PCT Filed: Jun. 9, 2000

(86) PCT No.: PCT/CN00/00150
§ 371 (c)(1),
(2), (4) Date: Nov. 9, 2001

(87) PCT Pub. No.: WO00/77601
PCT Pub. Date: Dec. 21, 2000

(30) Foreign Application Priority Data

Jun. 11, 1999 (CN) ........................ 99213741 U
Jun. 12, 1999 (CN) ........................ 99214382 U
Jun. 21, 1999 (CN) ........................ 99214288 U

(51) Int. Cl.⁷ ............................................. G06F 1/16
(52) U.S. Cl. .................... 361/687; 361/686; 361/704; 364/708.1; 454/184
(58) Field of Search ............................... 361/683, 687, 361/692–697, 701, 704, 707–710, 717–719, 721–722; 174/16.3; 165/80.2, 80.3, 80.4, 185, 104, 133–134, 121–126; 454/184; 257/721–727; 364/708.1; 437/209, 221, 222; 438/106, 118, 584, 675; 29/832, 841, 854, 729, 739; 62/259.2

(56) References Cited

U.S. PATENT DOCUMENTS

| | | | | |
|---|---|---|---|---|
| 5,042,257 A | * | 8/1991 | Kendrick et al. | 62/3.1 |
| 5,272,599 A | | 12/1993 | Koenen | |
| 5,353,863 A | | 10/1994 | Yu | |
| 5,513,070 A | | 4/1996 | Xie et al. | |
| 5,518,071 A | * | 5/1996 | Lee | 165/185 |
| 5,682,948 A | | 11/1997 | Bock | |
| 5,684,676 A | * | 11/1997 | Lin et al. | 361/704 |
| 5,748,445 A | * | 5/1998 | North et al. | 363/141 |
| 5,805,417 A | | 9/1998 | Nakagawa et al. | |
| 5,850,691 A | * | 12/1998 | Bell | 29/845 |
| 5,912,802 A | * | 6/1999 | Nelson | 361/695 |
| 5,917,697 A | * | 6/1999 | Wang | 361/695 |
| 6,113,485 A | * | 9/2000 | Marquis et al. | 454/184 |

FOREIGN PATENT DOCUMENTS

| | | | | |
|---|---|---|---|---|
| CN | 1167934 A | | 12/1997 | |
| JP | 407014954 A | * | 1/1995 | H01L/23/467 |

* cited by examiner

*Primary Examiner*—Darren Schuberg
*Assistant Examiner*—Michael Datskovsky

(57) ABSTRACT

A CPU cooling arrangement for portable computer is constructed to include a heat sink fastened to a CPU in a computer mainframe, the heat sink having two opposite open sides and a plurality of radiation fins defining a convection trough between each two adjacent radiation fins in communication with the open sides, a fan mounted in a fan hole on one sidewall of the computer mainframe, and a wing box coupled between the fan and one open side of the head sink.

12 Claims, 15 Drawing Sheets

CPU COOLING ARRANGEMENT FOR PORTABLE COMPUTER

BACKGROUND OF THE INVENTION

The present invention relates to a CPU cooling arrangement for portable computer and, more particularly, to such a CPU cooling arrangement, which requires less installation space and achieves a high cooling efficiency. The heat sink used in the CPU cooling arrangement provides a broad heat dissipation surface area that dissipates heat quickly from the CPU.

In order to make a portable computer compact for carrying, the thickness must be made as thinner as possible. A regular computer mainframe comprises a motherboard having a CPU socket and a CPU (central processing unit) installed in the CPU socket. The CPU produces much heat during its operation. In order to dissipate heat from the CPU, cooling means must be used. Conventionally, an aluminum-extruded heat sink is used with a fan in a portable computer to dissipate heat from the CPU. In a notebook computer, the keyboard is provided above the motherboard. There is little space between the keyboard and the motherboard for the installation of cooling means. In case a fan is installed, it cannot directly draw outside cooling air into the mainframe from the topside because the keyboard blocks the topside of the computer mainframe. According to conventional designs, aluminum heat plates and/or heat pipes are commonly used in notebook computers for dissipation of heat from the CPU. These conventional designs cannot efficiently rapidly carry heat away from the CPU. Further, regular heat sinks for desktop computers are less efficient for the drawback of limited heat dissipation surface area. Due to limited heat dissipation surface area, a conventional heat sink cannot achieve the desired heat dissipation effect even when a fan attached.

FIG. 1 is an exploded view of a CPU cooling structure according to the prior art. This design of CPU cooling structure comprises a heat sink 2 fastened to the CPU (central processing unit) 11, and a fan 3 fastened to the heat sink 2. The heat sink 2 comprises a contact base 21 disposed in contact with the top sidewall of the CPU 11, a plurality of upright radiation fins 22 upwardly extended from the contact base 21 and arranged in parallel, and a plurality of troughs 23 respectively defined between the radiation fins 22. The fan 3 has a plurality of mounting holes 31 respectively fastened to grooves in the heat sink 2 by tie screws 5. Due to limited heat dissipation surface area of the heat sink 2, this design of CPU cooling structure is not satisfactory in function.

SUMMARY OF THE INVENTION

The present invention has been accomplished to provide a CPU cooling arrangement, which eliminates the drawbacks of the conventional CPU cooling designs.

It is therefore the main object of the present invention to provide a CPU cooling arrangement for portable computer, which achieves a satisfactory heat dissipation effect.

According to one embodiment of the present invention, the CPU cooling arrangement comprises a motherboard invertedly fixedly mounted inside the computer mainframe holding the CPU at the bottom side, a heat sink mounted on the CPU at the bottom side, and a fan mounted on the heat sink at the bottom side and facing an air hole in the bottom shell of the computer mainframe for drawing outside cooling air upwardly into the computer mainframe toward the heat sink to carry heat away from the CPU efficiently. According to another aspect of the present invention, the installation of the CPU cooling arrangement enables outside cooling air to be directly drawn into the inside of the mainframe shell of the computer mainframe to carry heat away from the heat sink and the CPU. According to still another aspect of the present invention, the computer mainframe comprises a keyboard disposed at the topside and formed of a metal frame, a circuit board, and a set of key switches, and the motherboard is fixedly fastened with the circuit board of the keyboard to the metal frame of the keyboard.

According to another aspect of the present invention, the computer mainframe comprises a liquid crystal display module disposed at the topside, and the motherboard is fixedly fastened to a bottom sidewall of the liquid crystal display module.

According to still another aspect of the present invention, the computer mainframe comprises a protruded portion disposed in the bottom shell around the air hole and adapted to receive the fan. According to still another aspect of the present invention, the bottom shell of the computer mainframe is a flat shell.

According to still another aspect of the present invention, the heat sink has six sides, the six sides including two opposite open sides selectively for the mounting of the fan and four close sides, a contact base formed integral with one of the close sides, a plurality of radiation fins perpendicularly extended from the contact base and arranged in parallel, the radiation fins each comprising a plurality of protruded portions and recessed portions, and at least one convection trough respectively defined between the protruded portions and recessed portions of the radiation fins.

According to still another aspect of the present invention, the four close sides of the heat sink include a close topside having at least one air vent disposed in communication with the at least one convection trough. Alternatively, the close topside of the heat sink can be made having at least one elongated slot disposed in communication with the at least one convection trough, or having at least one air vent and one elongated slot disposed in communication with the at least one convection trough.

According to still another aspect of the present invention, two fans may be used and respectively mounted in the two opposite open sides of the heat sink.

According to still another alternate form of the present invention, the CPU cooling arrangement comprises a heat sink mounted on the top sidewall of the CPU, the heat sink having a plurality of peripheral sides, the peripheral sides including a plurality of close sides and two opposite open sides, the close sides including one forming a contact base disposed in contact with the CPU, a plurality of radiation fins respectively perpendicularly extended from the contact base, and at least one convection trough defined between the radiation fins; a fan; and a wind box, the wind box comprising an inner wind hole disposed in one end thereof and coupled to one open side of the heat sink, an outer wind hole disposed in an opposite end thereof in communication with a fan hole in the mainframe shell of the computer mainframe, a fan seat disposed in the outer wind hole and adapted to receive the fan, and two mounting flanges respectively disposed at top and bottom sides of the outer wind hole, the mounting flanges each having at least one screw hole respectively fastened to a respective screw hole of the mainframe shell with a respective tie screw. The radiation fins of the heat sink may be directly perpendicularly connected to the CPU. Further, the wind box can be formed integral with a part of the mainframe shell around the fan hole.

DETAILED DESCRIPTION OF THE PREFERRED EMBODIMENTS

The present invention will now be described by way of example with reference to the annexed drawings:

EXAMPLE I

Figure 1:
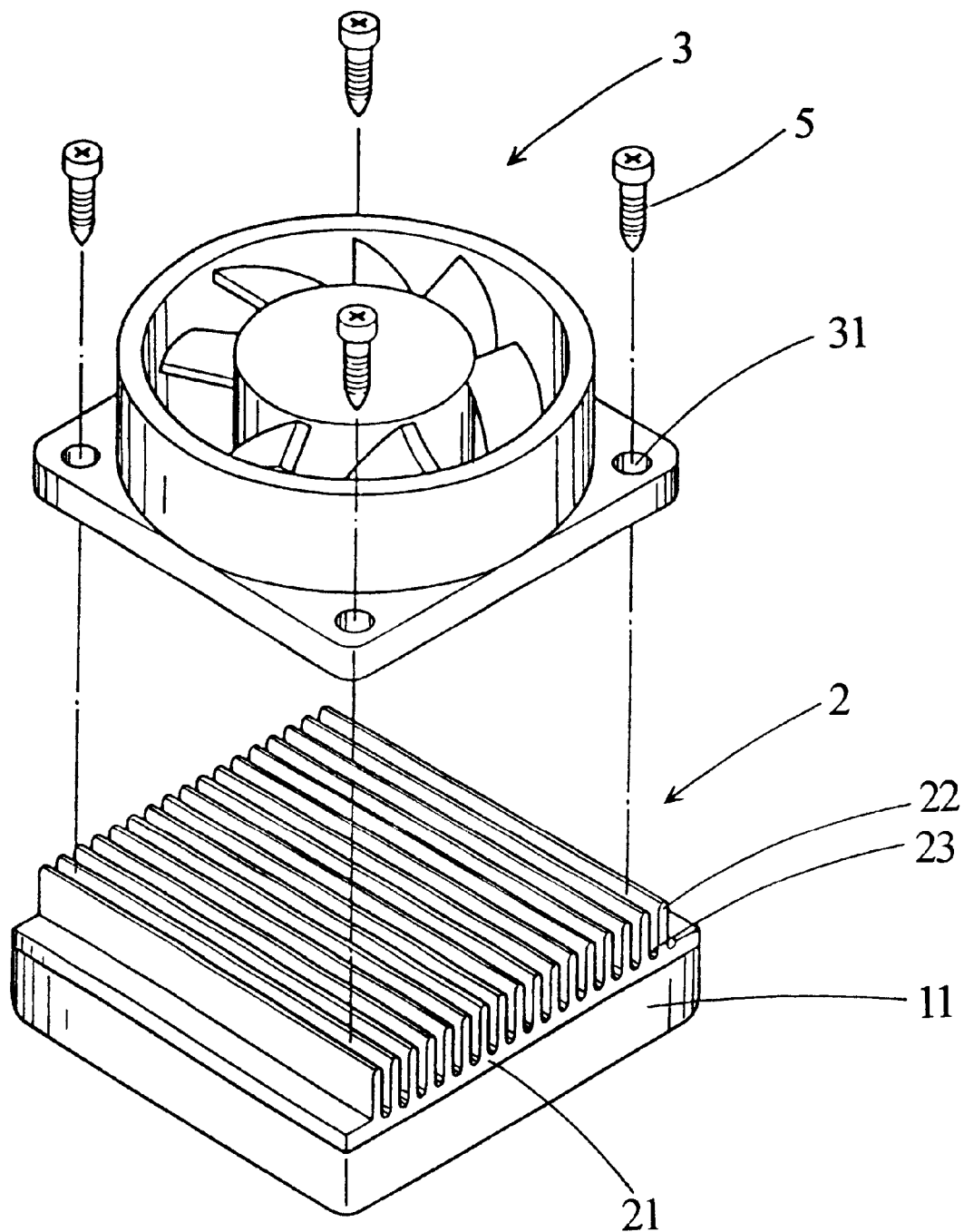
FIG. 1 is an exploded view of a CPU cooling structure according to the prior art.
Figure 2:
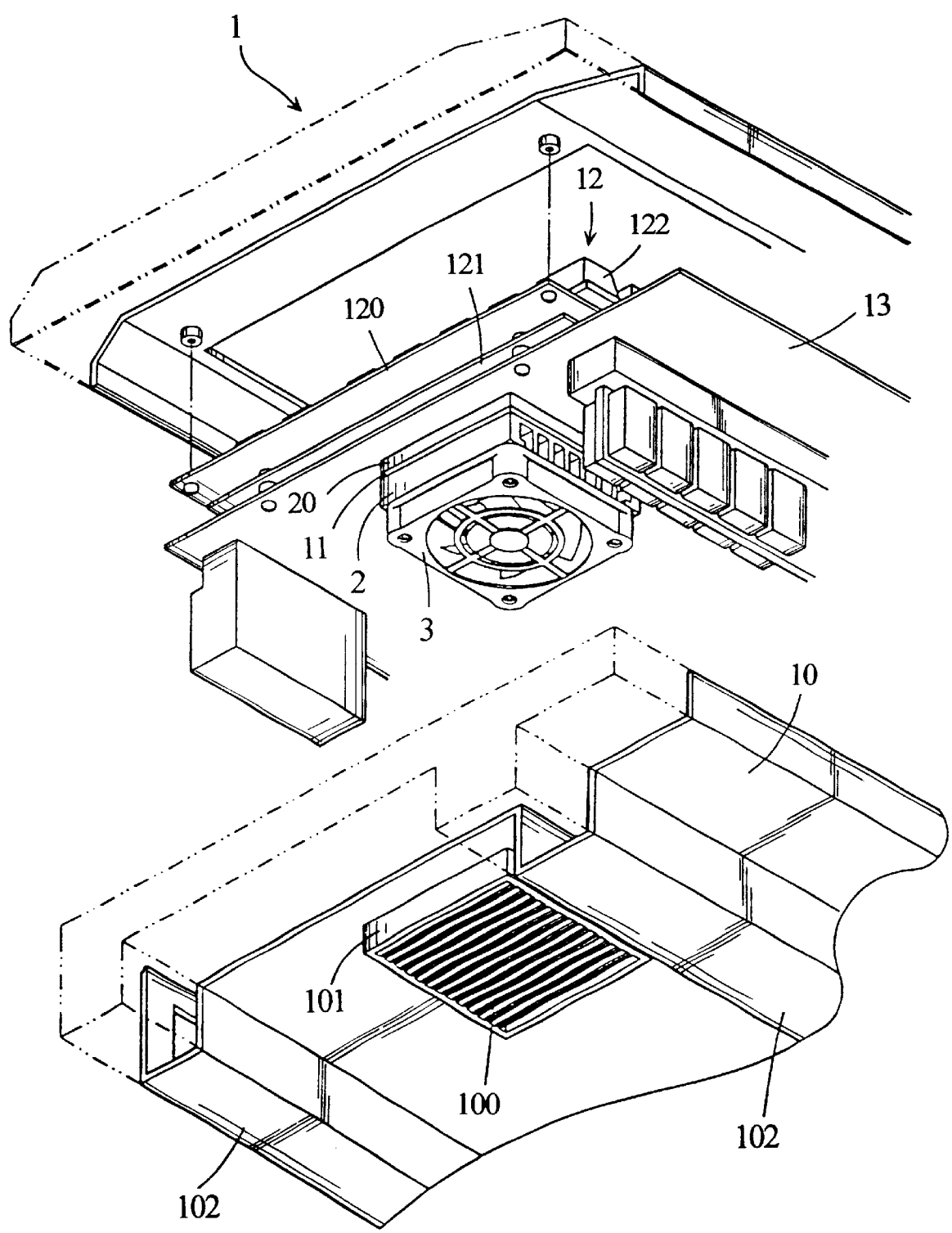
FIG. 2 is an exploded view of a CPU cooling arrangement for portable computer according to the present invention.
Figure 3:
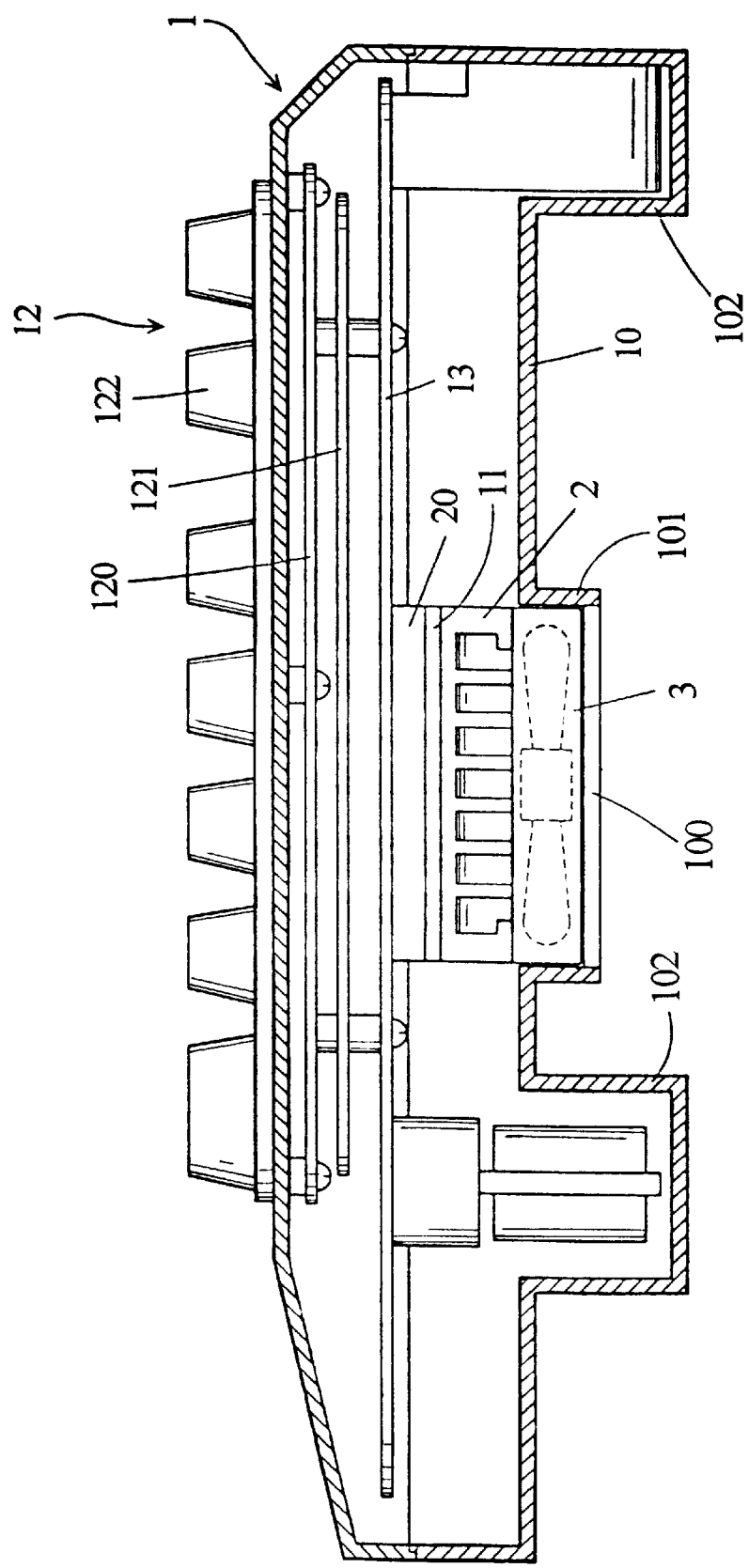
FIG. 3 is a sectional assembly view of the CPU cooling arrangement according to the present invention.

A portable computer CPU cooling arrangement in accordance with the first embodiment of the present invention is shown in FIGS. 2 and 3. An all-in-one motherboard 13 is installed in a portable computer mainframe 1, or a LCD (liquid crystal display) module 14 (see FIG. 4). The portable computer mainframe 1 has provided in the topside thereof a metal frame 120, a circuit board 121, and a keyboard 12 having a set of key switches 122. The motherboard 13 comprises a CPU socket 20, which receives a CPU (central processing unit) 11. On the surface of the CPU 11 there are mounted in proper order an aluminum-extruded heat sink 2 and a cooling fan 3. Unlike conventional designs, the motherboard 13 carrying the heat sink 2 and the cooling fan 3 is invertedly installed in the portable computer mainframe 1. The cooling fan 3 is coupled to the air vents 100 in the bottom shell 10 of the portable computer mainframe 1. The bottom shell 10 can be a flat shell. Alternatively, the bottom shell 10 can be made having a protruded portion 101 in which the air vents are provided (see FIG. 2). Ventilation flanges 102 may be provided, fitting over protruded electronic component parts, for example, memory means of the motherboard 13.

Because the high-performance aluminum-extruded heat sink 2 and cooling fan 3 are used with the CPU 11, heat can be quickly carried away from the CPU 11. The heat sink 2 has multiple radiation fins, which provide a broad surface area in contact with the air for quick dissipation of heat. The operation of the cooling fan 3 greatly increases the frequency of the air striking the aluminum-extruded heat sink 2. Because the heat sink 2 is mounted on the motherboard 13 that is invertedly installed in the portable computer mainframe 1, the keyboard 12 does not interfere with the operation of the cooling fan 3 to draw outside cooling air into the inside of the portable computer mainframe 1 through the air vents 100 toward the heat sink 2 and the CPU 11, enabling heat to be quickly carried away from the CPU 11. Therefore, the invention achieves a heat dissipation effect much better than the conventional portable computer heat dissipation designs.

Figure 4:
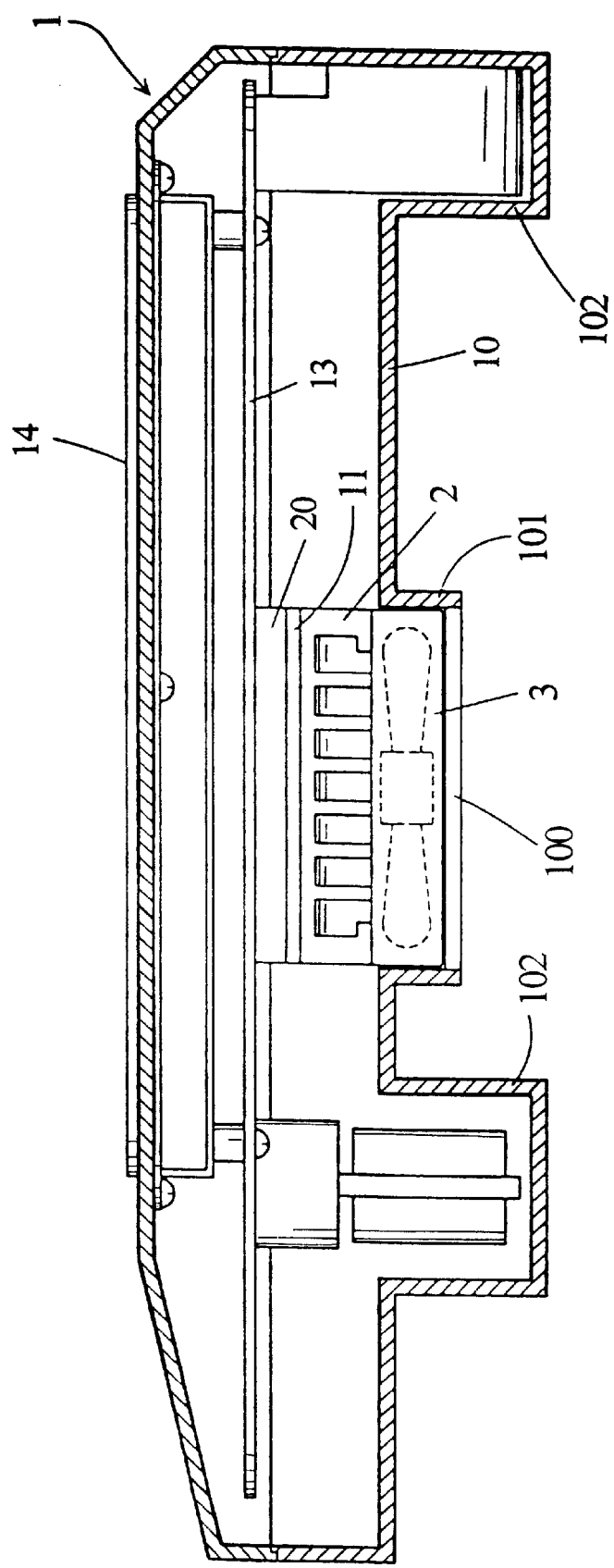
FIG. 4 is a sectional assembly view of an alternate form of the CPU cooling arrangement according to the present invention.

Further, because the motherboard 13 is invertedly mounted in the topside of the portable computer mainframe 1, the electronic elements of the motherboard 13 are respectively disposed facing the bottom side. In order to facilitate the assembly process, the motherboard 13 and the circuit board 121 of the keyboard 12 use a common metal frame 120, i.e., the motherboard 13 and the keyboard circuit board 121 are mounted on the metal frame 120, so that the internal space of the mainframe 1 can be fully utilized. In FIG. 4, the motherboard 13 is directly mounted in the bottom side of the LCD module 14 to minimize space occupation.

EXAMPLE II

Figure 5:
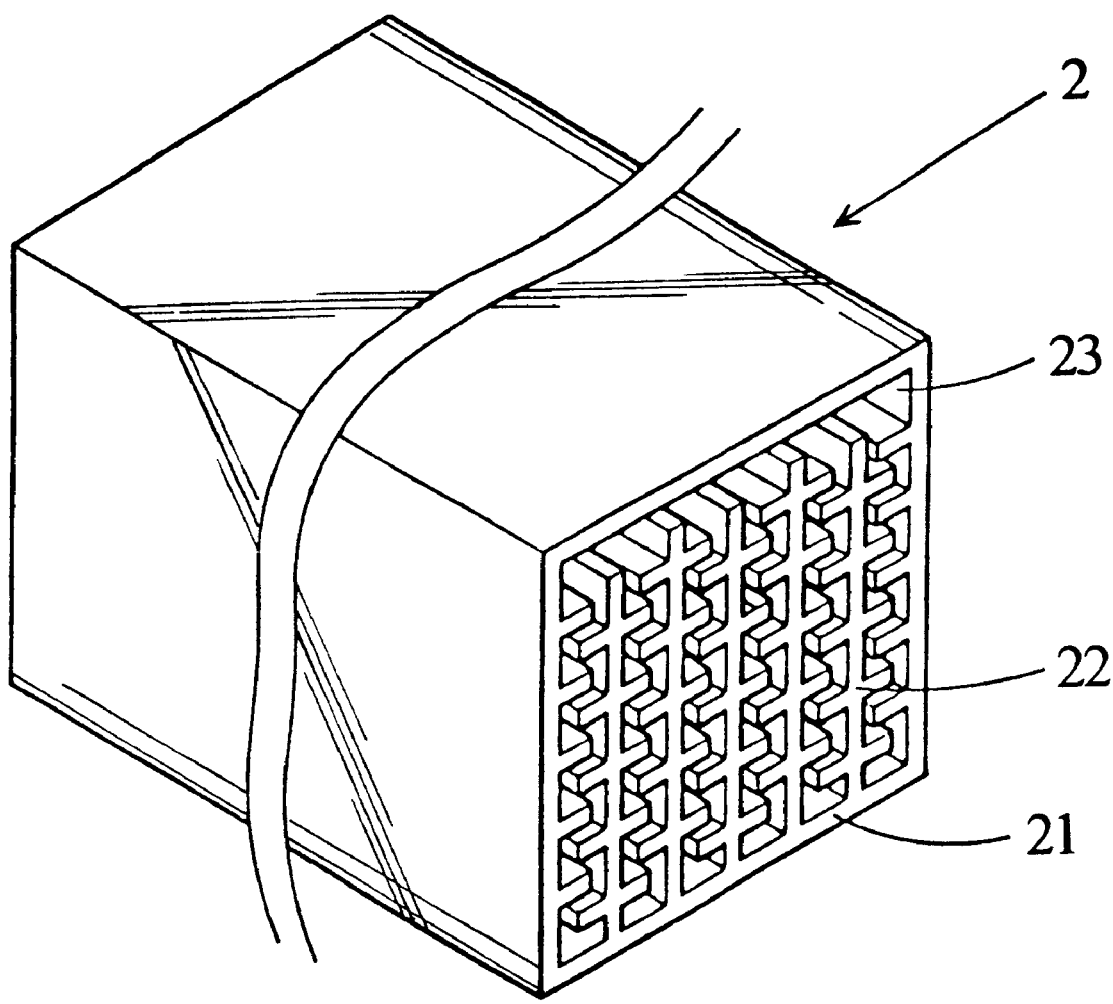
FIG. 5 is an elevational view of a heat sink for the CPU cooling arrangement according to the present invention.

Referring to FIG. 5, the heat sink 2 according to the second embodiment of the present invention comprises a contact base 21, a plurality of fishbone-like radiation fins 22 integral with the contact base 21, a convection trough 23 defined between each two adjacent radiation fin 22.

The heat sink 2 has six sides including two opposite open sides. The other four sides of the heat sink 2 are closed sides. The radiation fins 22 are respectively upwardly extended from the contact base 21. The radiation fins 22 have protruded and recessed portions, and a convection trough 23 is defined in the protruded and recessed space between each two adjacent radiation fins 22. This heat sink design has a broad heat dissipation area to improve heat dissipation efficiency. Because the heat sink 2 has a broad heat dissipation area wider than conventional designs, it transmits heat efficiently.

EXAMPLE III

Figure 6:
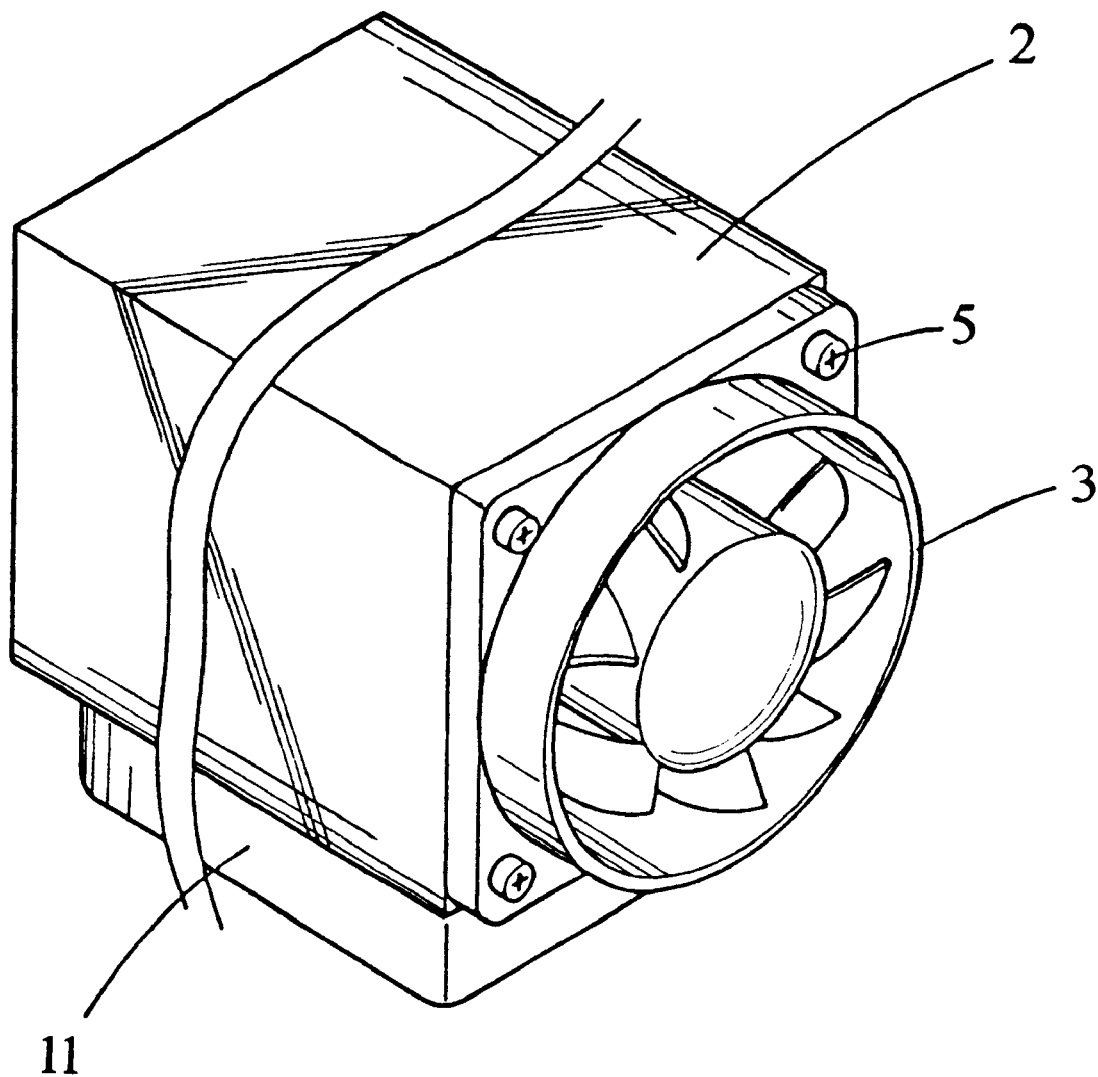
FIG. 6 is an elevational view showing a fan fixedly fastened to one side of the heat sink according to the present invention.
Figure 7:
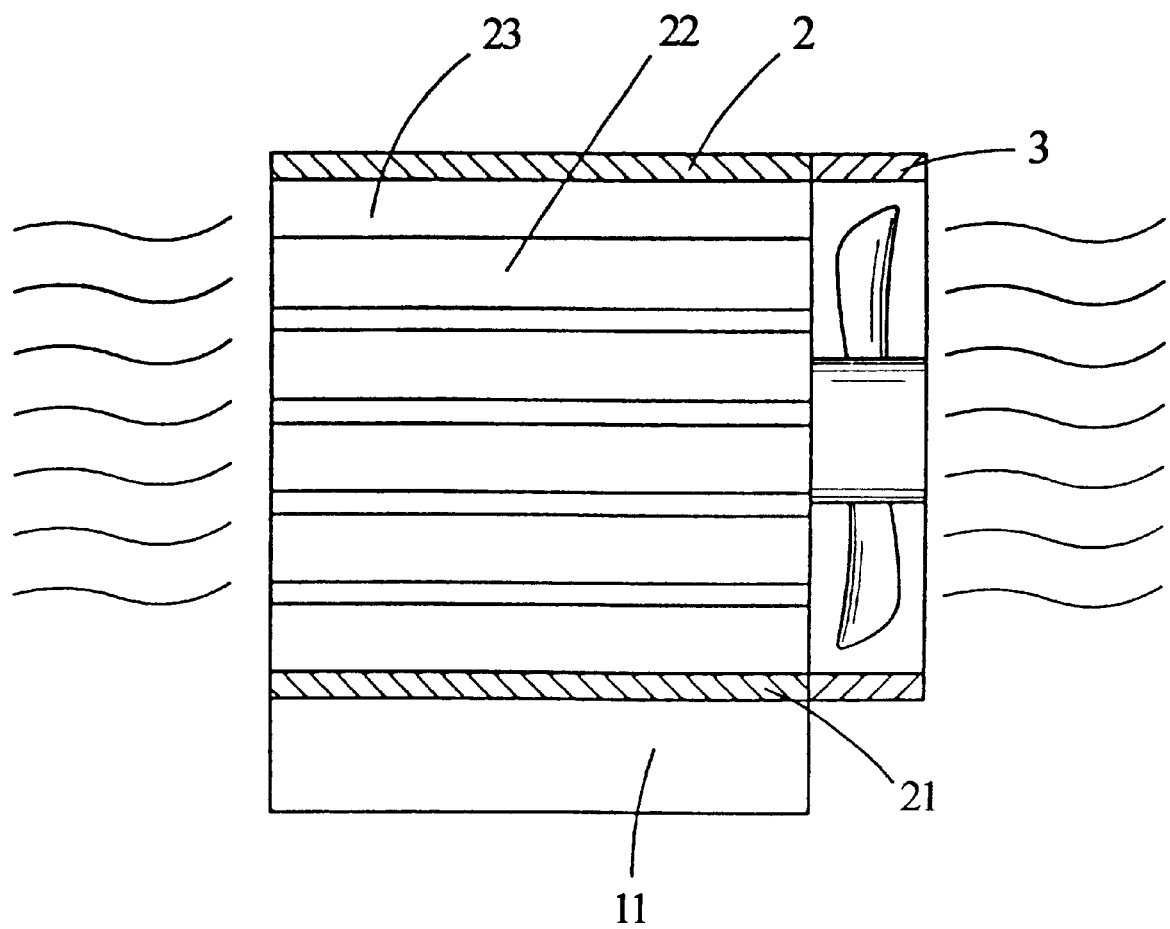
FIG. 7 is a schematic drawing showing heat dissipation effect of the CPU cooling arrangement according to the present invention.

FIGS. 6 and 7 are perspective and schematic drawings of a third embodiment of the present invention, showing the heat sink 2 used with the cooling fan 3. The cooling fan 3 is fixedly fastened to one open side of the heat sink 2 with tie screws 5. When the temperature of the bottom heat source (CPU) 11 start to produce heat, heat is rapidly transmitted to the contact base 21 of the heat sink 2 and then to the radiating fins 22, and then dissipated into the convection troughs 23, and at the same time the cooling fan 3 causes currents of air to carry heat away from the convection troughs 23 to the outside of the heat sink 2.

Two fans 3 may be provided at the two opposite open sides of the heat sink 2 to carry heat away from the heat sink 2 efficiently. In this case, the fans 3 include on suction fan and one exhaust fan.

As indicated, this embodiment efficiently carries heat away from the heat source 11 by means of a broad heat dissipation area. This embodiment is practical for the transmission of continuous heat.

EXAMPLE IV

Figure 8:
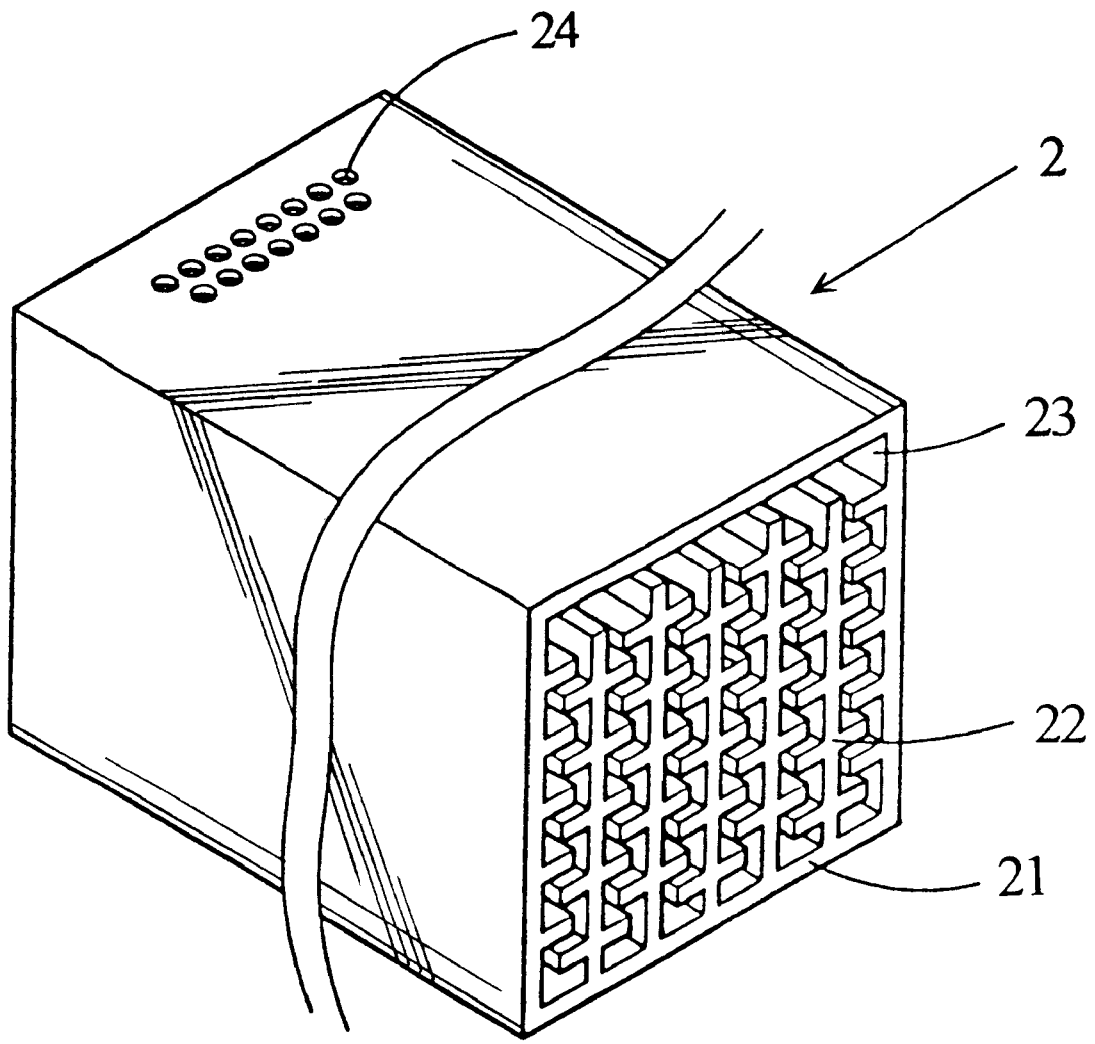
FIG. 8 is an elevational view of an alternate form of the heat sink for the CPU cooling arrangement according to the present invention.

FIG. 8 is an elevational view of the fourth embodiment of the present invention. According to this embodiment, the heat sink 2 has at least one air vent 24 in the top sidewall in communication with the convection troughs 23 for quick dissipation of heat.

EXAMPLE V

Figure 9:
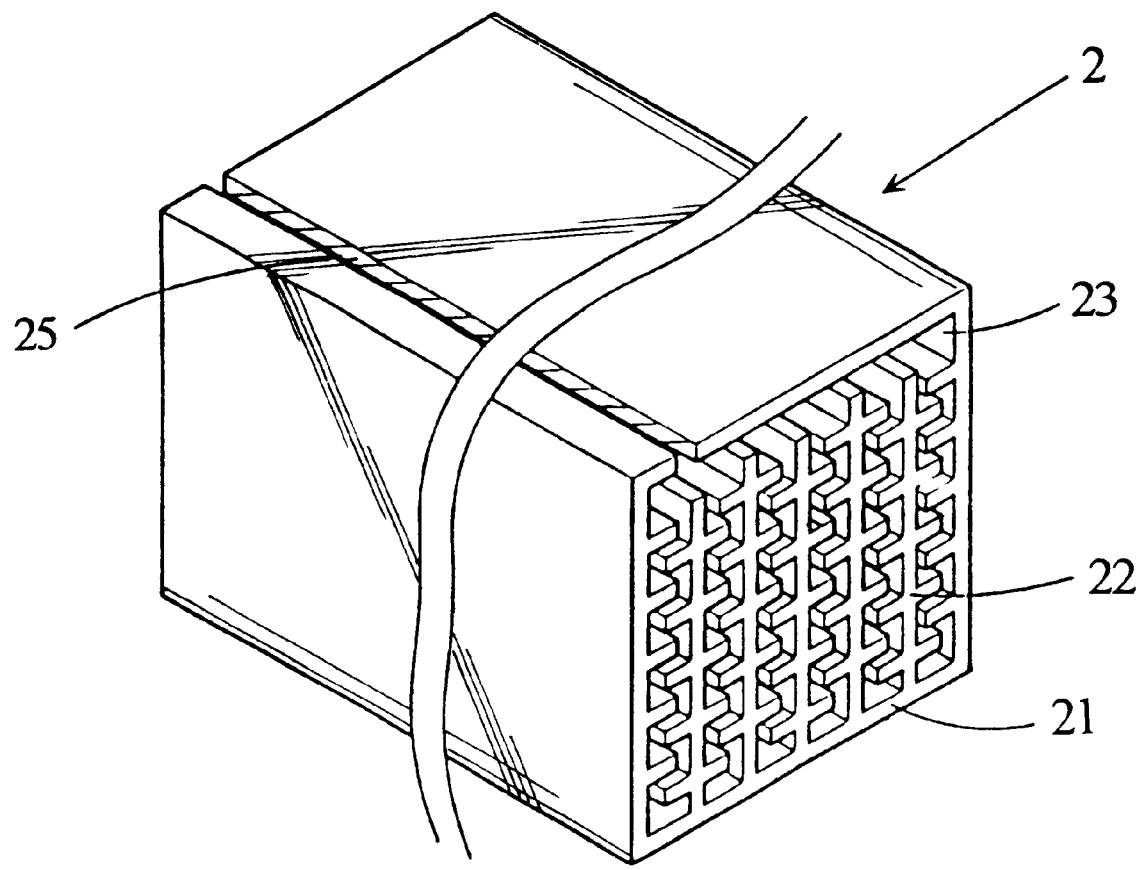
FIG. 9 is an elevational view of another alternate form of the heat sink for the CPU cooling arrangement according to the present invention.

FIG. 9 is an elevational view of the fifth embodiment of the present invention. According to this embodiment, the heat sink 2 has at least one line of heat dissipation slot 25 cut through the top sidewall n communication with the convection troughs 23 for quick dissipation of heat.

Alternatively, the aforesaid at least one air vent 24 and the at least one line of heat dissipation slot 25 can be concomitantly provided in the top sidewall of the heat sink 2 for quick dissipation of heat.

By means of increasing the heat dissipation area of the heat sink and changing the direction and position of the cooling fan, the invention greatly improves the heat dissipation efficiency, and eliminates the drawbacks of insufficient heat dissipation area and poor heat dissipation effect of the prior art heat sinks.

EXAMPLE VI

Figure 10:
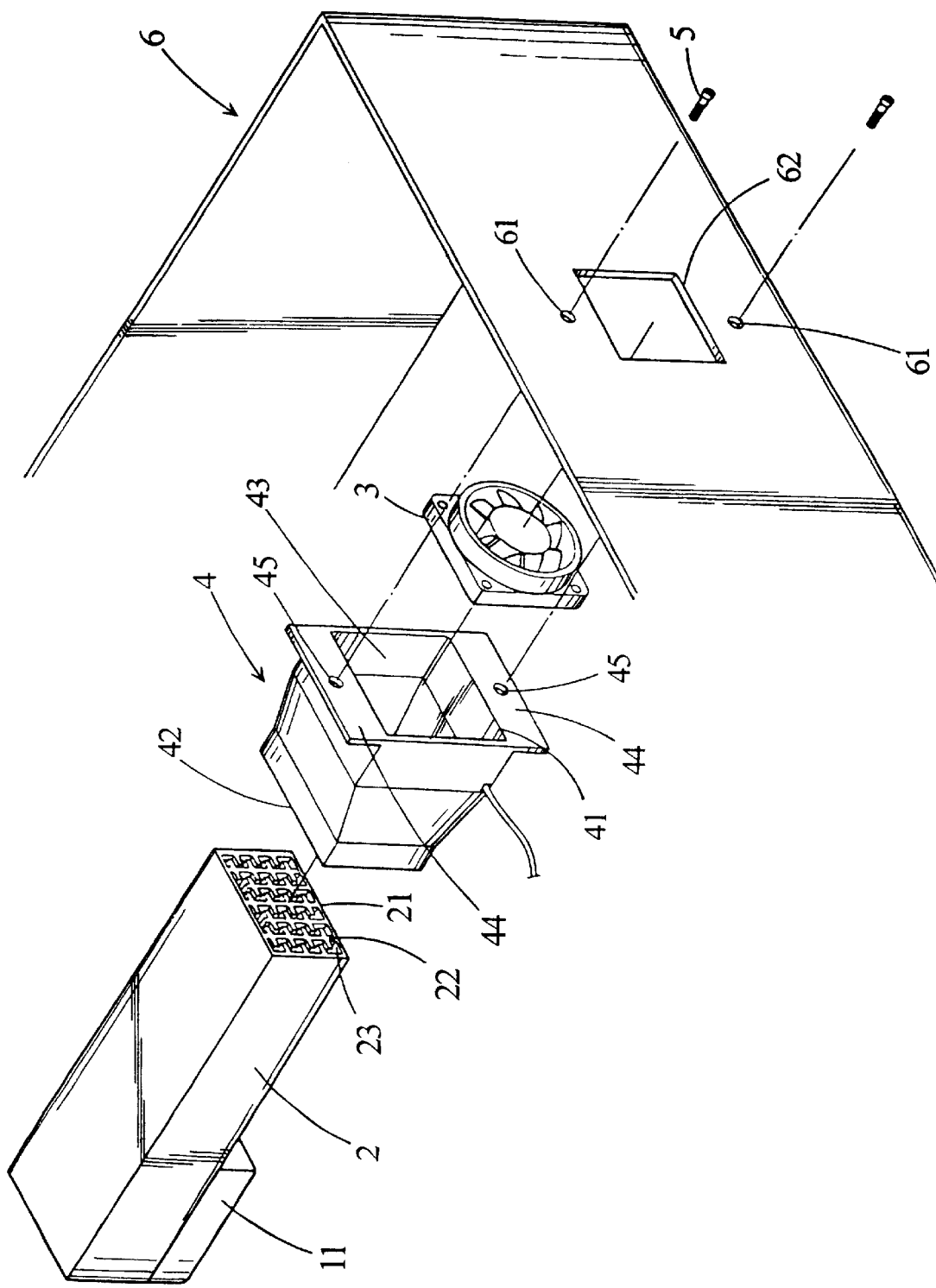
FIG. 10 is an exploded view of another alternate form of the CPU cooling arrangement according to the present invention.

FIG. 10 is an exploded view of the sixth embodiment of the present invention. This embodiment is comprised of a heat sink 2, a fan 3, and a wind box 4. The heat sink 2 is made of heat dissipation material and mounted on the topside of the CPU 11, having six sides including two opposite open sides and four close sides. The heat sink 2 comprises a bottom contact base 21, a plurality of radiation fins 22 upwardly extended from the contact base 21, and a convection trough 23 defined in between each two adjacent radiation fins 22. The fan 3 can be a suction fan or exhaust fan. The wind box 4 is an air conduit adapted to deliver flows of air, having an outer wind hole 41 in one open side thereof an inner wind hole 42 disposed in the other open side thereof and adapted to receive one end of the heat sink 2, a fan seat 43 in the outer wind hole 41 for the positioning of the fan 3, and two mounting flanges 44 respectively disposed at the top and bottom sides of the outer wind hole 41. The mounting flanges 44 each have a screw hole 45. The installation procedure of this embodiment is outlined hereinafter. The heat sink 2 is fixedly fastened to the topside of the CPU 11, and then the fan 3 is press-fitted into the fan seat 43 in the outer wind hole 41 of the wind box 4, and then the inner wind hole 42 of the wind box 4 is coupled to one end of the heat sink 2, and then the screw holes 45 of the mounting flanges 44 of the wind box 4 are respectively fastened two respective screw holes 61 in the mainframe shell 6 by respective tie screws 5, keeping the outer wind hole 43 connected to the fan hole 62 of the mainframe shell 6.

Figure 11:
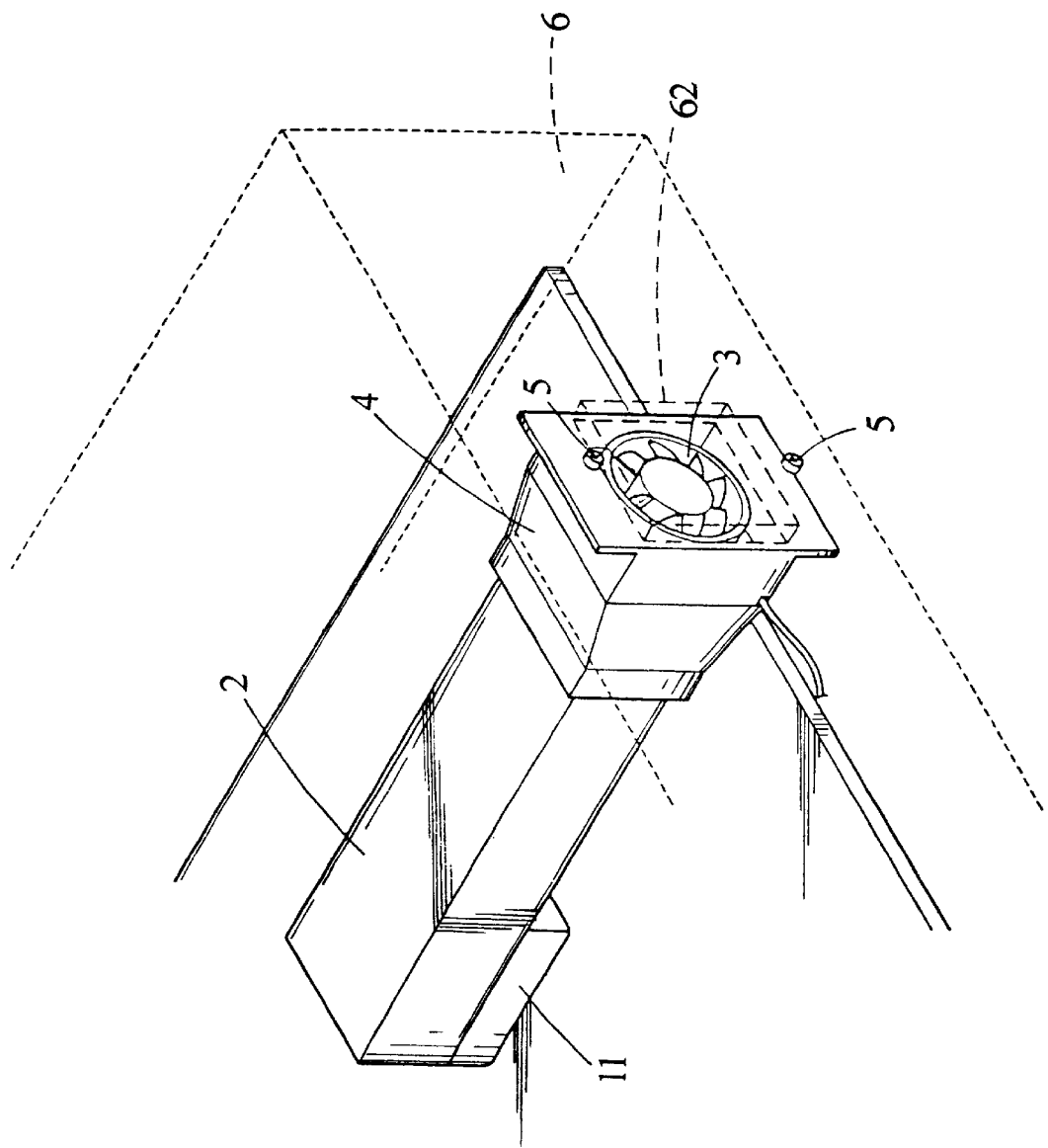
FIG. 11 is a perspective view showing the CPU cooling arrangement of FIG. 10 installed.

FIG. 11 is a perspective view showing the sixth embodiment of the present invention installed. As illustrated, the heat sink 2 has an elongated profile attached to the wind box 4. In addition to heat dissipation function, the heat sink 2 simultaneously serves as a heat dissipation air conduit. During the operation of the CPU 11, heat is quickly carried away from the CPU 11 to the outside of the mainframe shell 6. Because the heat sink 2 has an elongated profile, it provides a broad heat dissipation area to dissipate heat from the CPU 11 efficiently.

Figure 12:
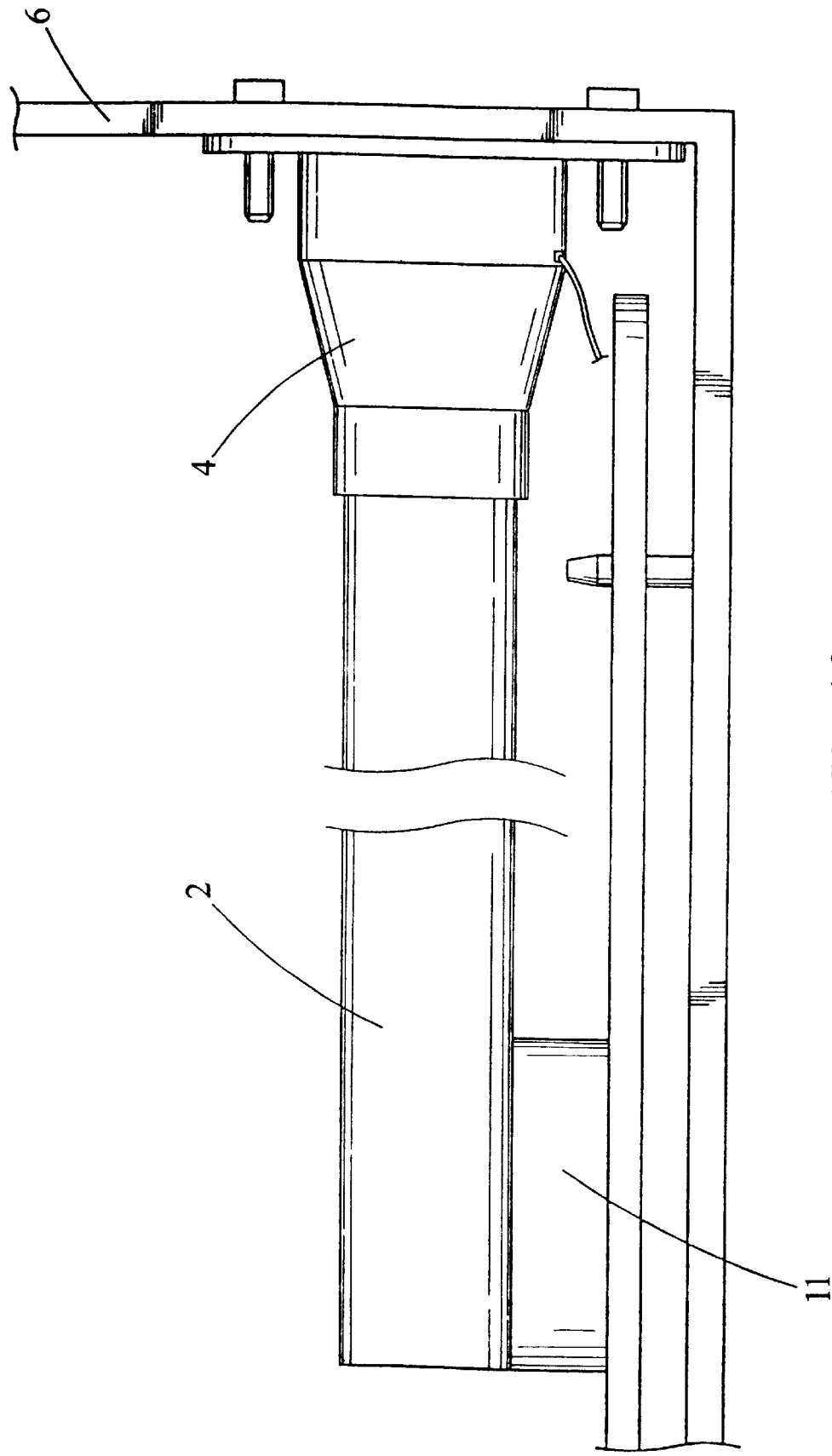
FIG. 12 is a side view in an enlarged scale of the CPU cooling arrangement shown in FIG. 11.
Figure 13:
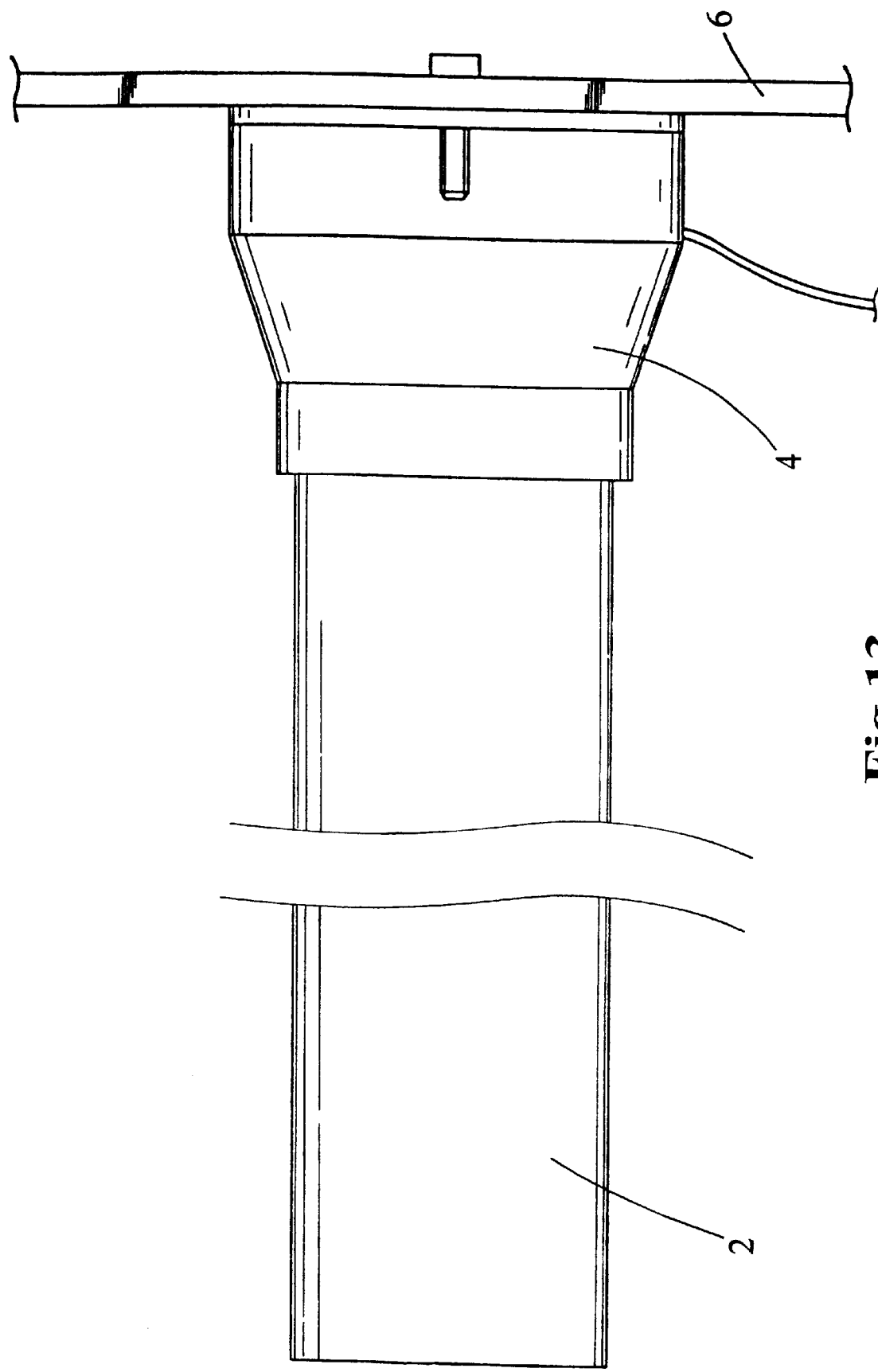
FIG. 13 is a top view of FIG. 12.

FIGS. 12 and 13 are side view and top view, showing the six embodiment of the present invention installed in the mainframe shell 6. As indicated, the heat sink 2 has a broad heat dissipation area, however the installation of the CPU cooling arrangement occupies less vertical space in the mainframe shell 6. The design of the fan 3 is free from the limitation of the configuration of the CPU 11, i.e., the dimensions and capacity of the fan 3 can freely be designed as desired.

EXAMPLE VII

Figure 14:
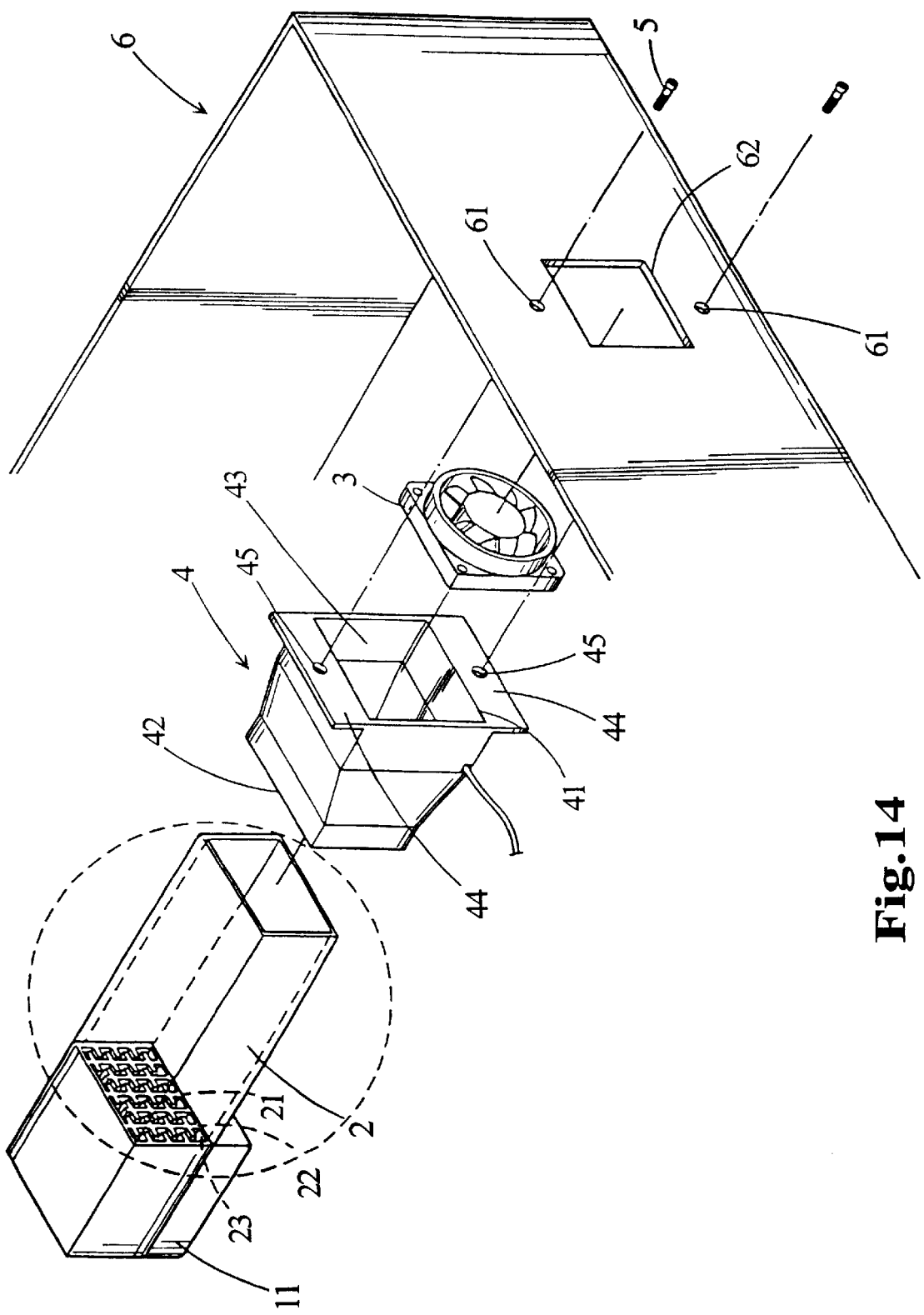
FIG. 14 is an exploded view of still another alternate form of the CPU cooling arrangement according to the present invention.

FIG. 14 is an exploded view of the seventh embodiment of the present invention. According to this embodiment, the radiation fins 22 of the heat sink 2 are directly perpendicularly connected to the surface of the CPU 11, and the extension part of the heat sink 2 forms a wind channel.

EXAMPLE VIII

Figure 15:
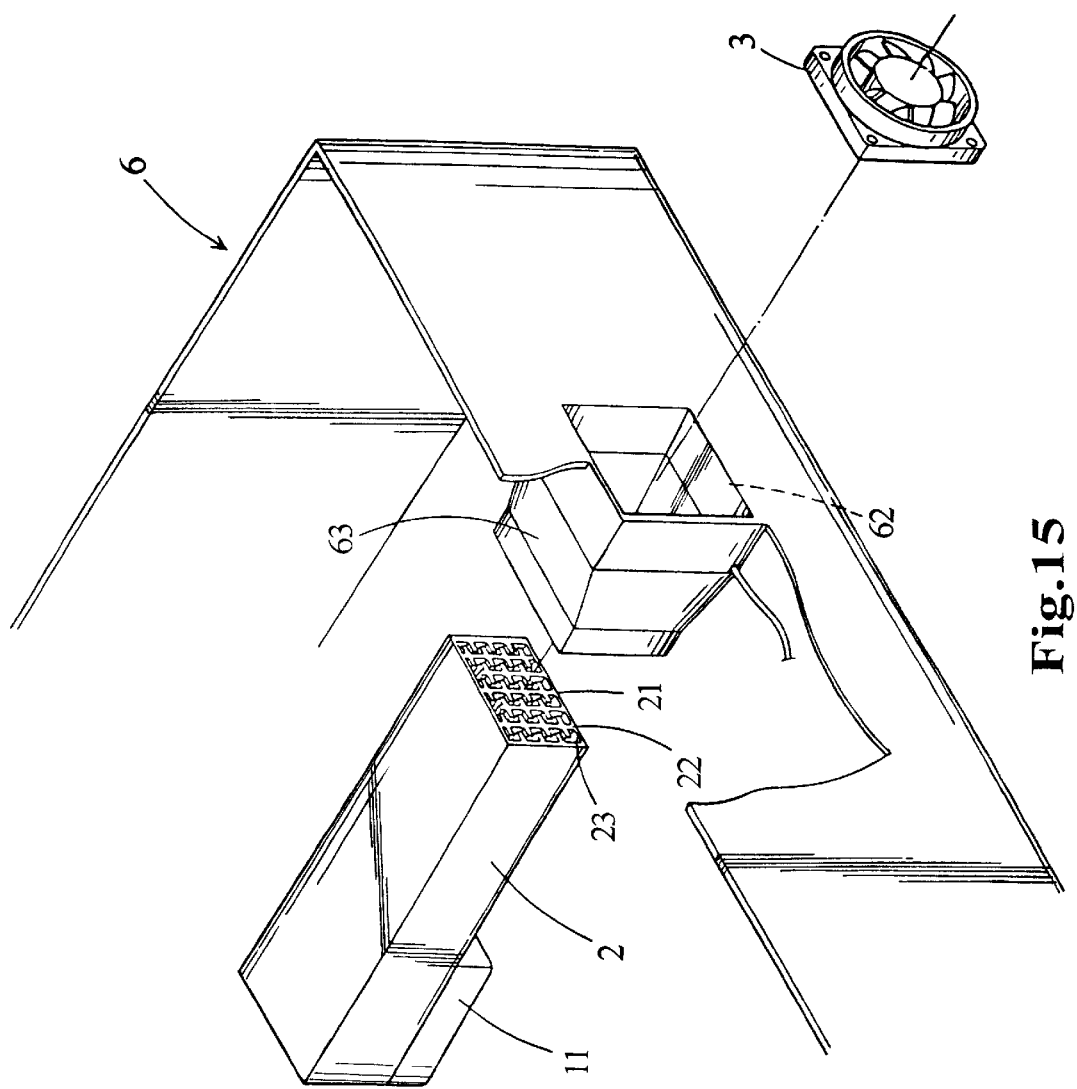
FIG. 15 is an exploded view of still another alternate form of the CPU cooling arrangement according to the present invention.

FIG. 15 is an exploded view of the eighth embodiment of the present invention. According to this embodiment, the wind box 63 is directly formed of a part of the mainframe shell 6 around the fan hole 62 by stamping.

As indicated above, the invention completely changes the conventional CPU heat dissipation structures. Because the CPU is the operation center of the computer, the normal functioning of the computer depends on the normal performance of the CPU. In order to keep the CPU working normally, the heat dissipation function of the CPU heat dissipation structure must be enhanced. Because the CPU heat dissipation operation of the conventional designs runs in the high temperature space within the mainframe shell, simply increasing the capacity of the fan cannot significantly reduce the temperature of the CPU. The technical contents and measures of the aforesaid embodiments of the present invention break through the bottleneck encountered in the conventional designs. The invention greatly increases the heat dissipation area, and expels heat from the area surrounding the CPU to the outside of the mainframe shell, or guides outside cooling air into the inside of the mainframe shell to lower the temperature of the CPU effectively.

The invention extends the length of the heat sink to the mainframe shell, and uses a wind box to hold the fan, enabling outside cooling air to be sucked into the inside of the mainframe shell or inside hot air to be expelled to the outside of the mainframe shell. By means of temperature difference, heat is quickly dissipated from the CPU.

In addition to the aforesaid embodiments of the present invention, various modifications may be made thereunto. For example, in FIGS. 2–4, the keyboard and the LCD module may be removed, enabling the fan to blow air from the topside toward the bottom side or, from the left side toward the right side. The existence of the keyboard or LCD module in the topside of the portable computer mainframe limits the upward operation direction of the fan. In general, the present invention enables the user to selectively install the fan in different directions to draw outside cooling air into the inside of the portable computer mainframe from different sides.

Physically, the portable computer CPU cooling arrangement of the present invention enables the fan to be coupled between the head sink and either side of the mainframe shell to draw outside cooling air toward the heat sink in case the keyboard or LCD module is not provided above the CPU, enabling heat to be quickly carried away from the CPU.

Further, in the aforesaid CPU cooling arrangement, the fan can be directly mounted on either side of the mainframe shell to draw outside cooling air toward the heat sink, enabling heat to be quickly carried away from the CPU.

Further, the CPU cooling arrangement can use the heat sink of either of the aforesaid second, third, fourth, and fifth embodiments, and the fan can be fastened to either open side of the heat sink. Alternatively, either of the sixth, seventh, and eighth embodiments can be used for the CPU cooling arrangement.

A prototype of portable computer CPU cooling arrangement has been constructed with the features of FIGS. 2–15. The portable computer CPU cooling arrangement functions smoothly to provide all of the features discussed earlier. Further, the heat sink and the cooling arrangement can also be used in other electric apparatus to dissipate heat.

What the invention claimed is:

1. A CPU cooling arrangement comprising a mainframe holding a motherboard, said motherboard comprising a CPU socket holding a CPU (central processing unit), a heat sink mounted on said CPU, and a fan mounted on said heat sink, wherein said motherboard is invertedly fixedly mounted inside said mainframe, holding said CPU, said heat sink, and said fan on a bottom sidewall of said motherboard; said mainframe comprises a bottom shell and an air hole disposed in said bottom shell, said air hole facing said fan for enabling said fan to draw outside cooling air toward said heat sink for dissipation heat from said CPU.

2. The CPU cooling arrangement as claimed in claim 1 wherein said mainframe comprises a keyboard disposed at a topside thereof and formed of a metal frame, a circuit board, and a set of key switches, and said motherboard is fixedly fastened with the circuit board of said keyboard to said metal frame of said keyboard.

3. The CPU cooling arrangement as claimed in claim 1 wherein said mainframe comprises a liquid crystal display module disposed at a topside thereof, said motherboard is fixedly fastened to a bottom sidewall of said liquid crystal display module.

4. The CPU cooling arrangement as claimed in claim 1 wherein said mainframe comprises a protruded portion disposed in said bottom shell around said air hole and adapted to receive said fan.

5. The CPU cooling arrangement as claimed in claim 1 wherein said bottom shell of said mainframe is a flat shell.

6. A CPU cooling arrangement mounted in a mainframe shell for computer and adapted to dissipate heat from a CPU (central processing unit), comprising:

a heat sink mounted on a top sidewall of the CPU, said heat sink having a plurality of peripheral sides, said peripheral sides including a plurality of close sides and two opposite open sides, said close sides including one forming a contact base disposed in contact with said CPU, a plurality of radiation fins respectively perpendicularly extended from said contact base, and at least one convection trough defined between said radiation fins;

a fan; and a wind box, said wind box comprising an inner wind hole disposed in one end thereof and coupled to one open side of said heat sink, an outer wind hole disposed in an opposite end thereof in communication with a fan hole in said mainframe shell for computer, a fan seat disposed in said outer wind hole and adapted to receive said fan, and two mounting flanges respectively disposed at top and bottom sides of said outer wind hole, said mounting flanges each having at least one screw hole respectively fastened to a respective screw hole of said mainframe shell for computer with a respective tie screw.

7. The CPU cooling arrangement as claimed in claim 6 wherein said radiation fins of said heat sink are respectively perpendicularly connected to said CPU, and said heat sink having an extension part forming an air channel.

8. The CPU cooling arrangement as claimed in claim 6 wherein said wind box is formed integral with a part of said mainframe shell around said fan hole.

9. A CPU cooling arrangement comprising a heat sink and at least one fan, wherein said heat sink has six sides, said six sides including two opposite open sides for the mounting of said at least one fan and four close sides, a contact base formed integral with one of said close sides, a plurality of radiation fins perpendicularly extended from said contact base and arranged in parallel, said radiation fins each comprising a plurality of protruded portions and recessed portions, and at least one convection trough respectively defined between the protruded portions and recessed portions of said radiation fins, and wherein the four close sides of said heat sink include a close topside having at least one air vent and one elongated slot disposed in communication with said at least one convection trough.

10. A CPU cooling arrangement comprising a mainframe, a motherboard mounted inside said mainframe, said motherboard having CPU socket, a CPU (central processing unit) installed in said CPU socket, a heat sink mounted on a top sidewall of said CPU, and a fan mounted in said heat sink, wherein said fan is coupled between said heat sink and one sidewall of a mainframe shell of said mainframe and adapted to draw cooling air from the outside of said mainframe toward said heat sink, and wherein said heat sink has a plurality of peripheral sides, said peripheral sides including a plurality of close sides and two opposite open sides, said close sides including one forming a contact base disposed in contact with said CPU, a plurality of radiation fins respectively perpendicularly extended from said contact base, and at least one convection trough defined between said radiation fins.

11. The CPU cooling arrangement as claimed in claim 10, wherein said radiation fins of said heat sink are respectively perpendicularly connected to said CPU, and said heat sink having an extension part forming an air channel.

12. The CPU cooling arrangement as claimed in claim 10, wherein said wind box is formed integral with a part of said mainframe shell around said fan hole.

* * * * *